United States Patent
Bakk

(10) Patent No.: US 9,521,777 B2
(45) Date of Patent: Dec. 13, 2016

(54) COOLING SYSTEM FOR ELECTRONIC COMPONENTS AND LED LAMP HAVING THE SAME

(75) Inventor: Istvan Bakk, Törökbalint (HU)

(73) Assignee: Tridonic Jennersdorf GmbH, Jennersdorf (AT)

( * ) Notice: Subject to any disclaimer, the term of this patent is extended or adjusted under 35 U.S.C. 154(b) by 199 days.

(21) Appl. No.: 13/993,236

(22) PCT Filed: Nov. 30, 2011

(86) PCT No.: PCT/EP2011/071368
§ 371 (c)(1),
(2), (4) Date: Jul. 17, 2013

(87) PCT Pub. No.: WO2012/084436
PCT Pub. Date: Jun. 28, 2012

(65) Prior Publication Data
US 2013/0286666 A1   Oct. 31, 2013

(30) Foreign Application Priority Data
Dec. 20, 2010 (DE) .................. 10 2010 063 550

(51) Int. Cl.
*H05K 7/20* (2006.01)
*F21V 29/503* (2015.01)
(Continued)

(52) U.S. Cl.
CPC .............. *H05K 7/20136* (2013.01); *F04F 7/00* (2013.01); *F21K 9/23* (2016.08); *F21K 9/232* (2016.08);
(Continued)

(58) Field of Classification Search
CPC ........ F21V 29/40; F21V 29/508; F21V 29/63; H01L 23/4332; H01L 23/4336; H05K 1/0272; H05K 7/20136; H05K 7/20145
(Continued)

(56) References Cited

U.S. PATENT DOCUMENTS 5,021,924 A * 6/1991 Kieda et al. .................. 361/699
5,758,823 A * 6/1998 Glezer .................... B64C 21/08
239/11
(Continued)

FOREIGN PATENT DOCUMENTS

WO   WO 2009072046 A1 *  6/2009

OTHER PUBLICATIONS

U.S. Appl. No. 61/376,866, filed Aug. 25, 2010.*
(Continued)

*Primary Examiner* — Anh Mai
*Assistant Examiner* — Steven Horikoshi
(74) *Attorney, Agent, or Firm* — The H.T. Than Law Group

(57) ABSTRACT

The present invention is directed to a cooling system (1) for electronic components (4). The cooling system (1) comprises means (7) for producing cyclic air pressure fluctuations, wherein the electronic components (4) are distanced from the pressure producing means (7). In the vicinity of the electronic components (4) are situated means (5), preferably restrictions like holes, which are affected by the cyclic air pressure fluctuations, and which produce cyclic air jets (6). The air jets (6) affect the surface of the electronic component (4), and since the air jets (6) originate directly in the vicinity of the electronic components (4), an efficient heat transfer is affected. Preferably, the pressure producing means (7) actuate a pressure Pc inside a chamber (2), and turbulent air jets
(Continued)

(6) are produced through holes (5) of a substrate (3), onto which electronic components (4) are mounted.

13 Claims, 4 Drawing Sheets

(51) Int. Cl.
| | |
|---|---|
| *H01L 23/433* | (2006.01) |
| *F04F 7/00* | (2006.01) |
| *F21V 29/02* | (2006.01) |
| *H01L 23/467* | (2006.01) |
| *H01L 23/473* | (2006.01) |
| *F21V 29/63* | (2015.01) |
| *F21V 29/74* | (2015.01) |
| *F21V 29/83* | (2015.01) |
| *F21Y 101/00* | (2016.01) |

(52) U.S. Cl.
CPC ............. *F21V 29/02* (2013.01); *F21V 29/503* (2015.01); *F21V 29/63* (2015.01); *F21V 29/74* (2015.01); *H01L 23/467* (2013.01); *H01L 23/4735* (2013.01); *F21V 29/83* (2015.01); *F21Y 2101/00* (2013.01); *H01L 2924/0002* (2013.01); *Y02B 20/30* (2013.01)

(58) Field of Classification Search
USPC .................................................. 361/691, 692
See application file for complete search history.

(56) References Cited

U.S. PATENT DOCUMENTS

| | | |
|---|---|---|
| 6,650,542 B1 | 11/2003 | Chrysler et al. |
| 2005/0011212 A1 | 1/2005 | Bistekos |
| 2006/0227558 A1* | 10/2006 | Osawa .................... F21K 9/135 362/351 |
| 2010/0033071 A1* | 2/2010 | Heffington et al. ............. 313/46 |
| 2010/0065260 A1* | 3/2010 | Sakamoto ............... B06B 1/045 165/121 |
| 2010/0258274 A1 | 10/2010 | Van Der Tempel et al. |
| 2011/0240260 A1 | 10/2011 | Van Der Tempel |
| 2012/0051058 A1* | 3/2012 | Sharma et al. ................ 362/294 |

OTHER PUBLICATIONS

International Search Report issued in connection with the corresponding International Application No. PCT/EP2011/071368 on Mar. 15, 2012.

* cited by examiner

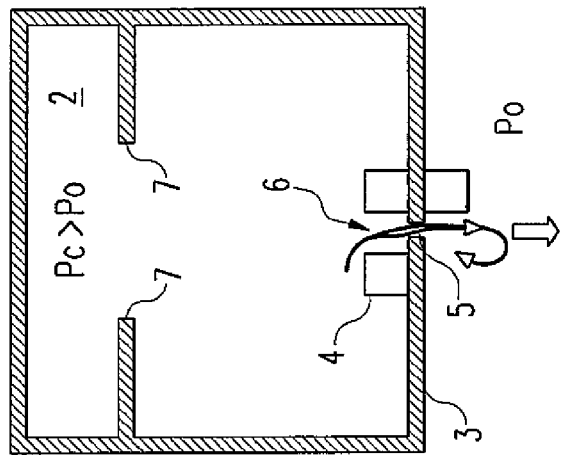
Fig. 2b Phase 2: jet out
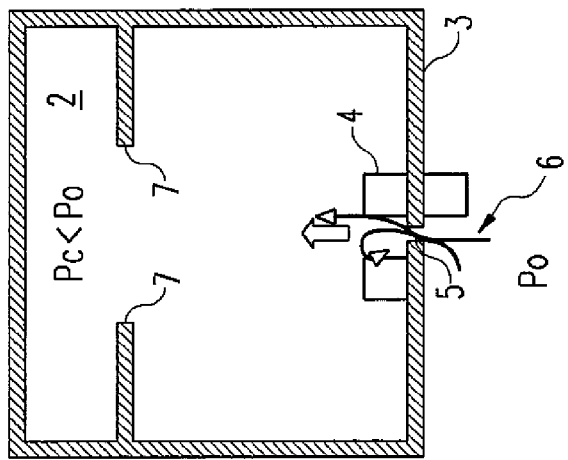
Fig. 2a Phase 1: jet in

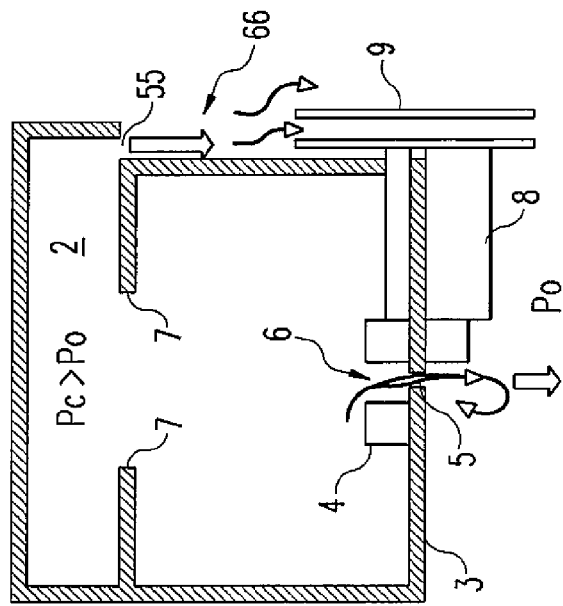
Fig. 3b — Phase 2: jet out
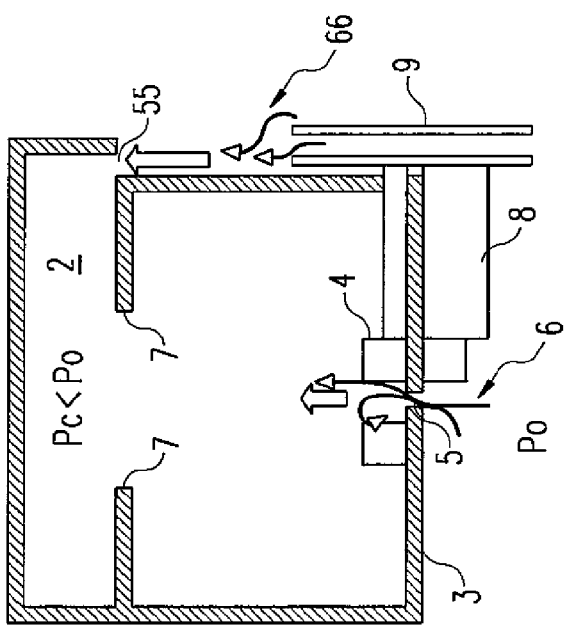
Fig. 3a — Phase 1: jet in

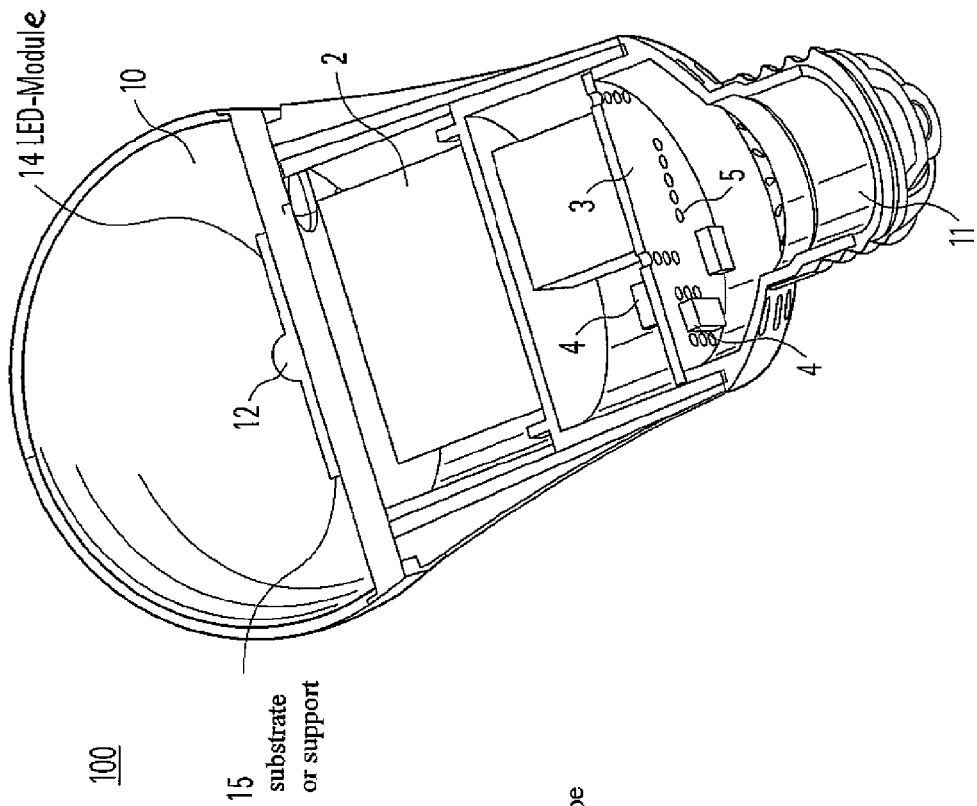
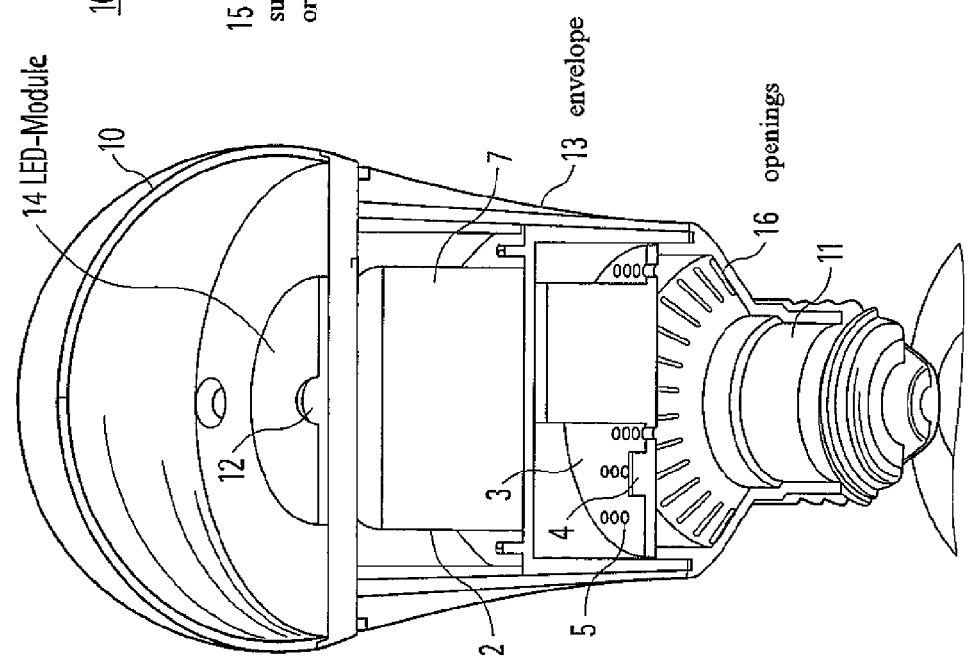
Fig. 4b
Fig. 4a

COOLING SYSTEM FOR ELECTRONIC COMPONENTS AND LED LAMP HAVING THE SAME

BACKGROUND OF THE INVENTION

The present invention relates to a cooling system and method for electronic components, and especially a cooling system for electronic components, which is integrated into a LED lamp, especially a retrofit LED lamp. The cooling system according to the present invention works by producing cyclic air pressure fluctuations, which produce cyclic air jets affecting and cooling the surface of the electronic components.

LED lamps, especially retrofit LED lamps, which include one or more light emitting diodes, LEDs, require for operation electronic components. In higher wattage LED bulbs the electronic components produce a significant amount of heat, due to conversion losses. Especially in retrofit LED lamps, which operate with high intensity LEDs, and which are closed by a bulb, the heat generation is extremely high, and can negatively influence the performance and the lifetime of the lamp. Therefore, active or forced cooling of the electronic components inside such a lamp is required. Active or forced cooling is typically achieved by air transport, wherein hot air is transported away from the electronic components or the heat sources in general, and cooler air flows in to replace the hot air. Active cooling by the use of directed air jets, which provide a very turbulent air flow (the so-called Nusselt number the ratio of convective to conductive heat transfer is high), provide a very efficient and concentrated way to remove heat from surfaces of electronic components, in comparison with conventional, fan like solutions.

FIGS. 1a and 1b show a heat sink 10 for a heat source 40, like electronic components of an LED lamp, according to the state of art, which uses a turbulent jet formation for the active cooling. Such state of the art cooling systems typically comprises a chamber 20, which is provided with an engine, which produces an air pressure Pc in the chamber 20, which is lower than the outside air pressure Po in a first "intake" phase, and higher than the outside air pressure Po in a second "jet forming" phase. The chamber 20 has a nozzle 50, through which air is taken in or expulsed from the chamber 20, respectively, depending on whether the air pressure Pc in the chamber 20 is higher or lower than the outside air pressure Po. The nozzle 50 is directed towards one or more heat sink fins 90, onto which a heat source, i.e. an electronic component 40, is attached. The nozzle 50 and the heat sink fins 90 form an air channel, and the nozzle 50 is oriented to the heat fins 90, so that air is taken in or is expulsed, and flows mainly parallel to the orientation of the heat sink fins 90, which have an elongate shape.

In the first phase, the "intake" phase, air is taken in into the chamber 20, and there is no significant cooling effect on the heat sink fins 90. In the second phase, the "jet forming phase", an air jet is formed in the nozzle 50, indicated by the fat arrow, which is directed along the elongate surface of the heat sink fins 90. The air jet further retains a secondary air flow indicated by the small arrows from the left and the right of the heat sink fins 90, and the highly turbulent flow package washes the surface of the heat sink fins 90, whereby a considerable cooling effect on the fins 90 is achieved.

Apart from the fact that only the "jet forming" phase contributes to the cooling, a further disadvantage of the above state of the art solution is that it is not well suited, for a case, where different electronic components heat up to different temperatures. The state of the art solution needs to interface each electronic component with one of a plurality of different heat sink fins 90, because if only one heat sink fin 90 would be applied to several electronic components 40, the higher heat dissipating electronic components 40 would heat up the other components, which themselves heat up only to a lower temperature. The requirement of multiple heat sink fins 90 in the state of the art solution makes more compact designs impossible. Further, heat sink fins 90 do not provide a direct cooling of the heat source, but an indirect cooling, and heat sink fins 90, which are typically made of metal, provides an additional safety risks, if provided on the outside of the lamp.

SUMMARY OF THE INVENTION

An object of the present invention is thus to provide a cooling system and cooling method, which improves the state of the art in respect to the above-mentioned disadvantages. In particular, a solution by which various heat dissipating components, especially components, which are difficult to interface with a heat sink or heat sink fins, can be cooled more efficiently. Further, an object is to provide a cooling system or cooling method, by which a more compact design is possible.

The solutions to the above-mentioned problems are provided by the present invention as defined by the attached independent claims. The dependent claims further develop the advantages of the invention.

The present invention is directed to a cooling system for electronic components comprising means for producing cyclic air pressure fluctuations, wherein the electronic components are distanced from the pressure producing means, means in the vicinity of the electronic components, which are affected by the cyclic air pressure fluctuations, and which produce cyclic air jets affecting the surface of the electronic components in order to increase the heat transfer at these surfaces (in comparison to not having such air jets). "Air jets" are to be understood as confined areas in which air is moved, essentially at coherent speed and in a defined direction. Air jets air produced actively (contrary to displacing air by convection).

In the inventive cooling system the air jets are directly produced in the vicinity of the heat source, namely the electronic components, and a very efficient interaction of the air jets, which are typically turbulent, with the surface of the electronic components is provided. The air jets do not have to flow from the pressure producing means to the electronic components, but are produced directly at the location of the electronic components. Therefore, an air channel, and heat fins can be omitted, and the cooling system can be designed more compact.

Preferably, a distance between the electronic components and the means producing the cyclic air jets is smaller than 10 mm. The closer the means are distanced to the electronic components, the more efficient the cooling of the electronic components is, and the more compact the cooling system can be constructed. If the components are placed besides the means (the cooled side of the component faces perpendicular to the air jets), the distance can be 0 to 5 mm. If the component is placed above the means (the cooled side of the component faces the air jets), a distance in a range of 1 to 20 mm can be achieved.

Preferably, the cooling system further comprises a chamber, wherein the pressure producing means are provided, and produce a cyclic chamber air pressure, which is alternately higher and lower than the air pressure outside of the chamber, a substrate constituting one sidewall of the chamber, the electronic components being attached to a surface of the substrate, wherein the substrate is provided with at least one hole, which produces the cyclic air jets due to the cyclic chamber air pressure.

By designing the means, which produce the cyclic air jets, in the form of holes in the substrate, on which the electronic components are attached, the location, at which the air jets are generated, can be provided very close to the electronic components. Thus, the cooling effect is enhanced. If more electronic components, which might dissipate different amounts of heat, are to be cooled, multiple holes can be strategically placed in the substrate, so that an optimum cooling effect for all electronic components is achieved. When the air jets pass through the holes in the substrate, turbulences are produced in the area of the electronic components, which provide very efficient cooling. The cyclic air jets cool the electronic components in both phases of the pressure producing means, firstly when the chamber air pressure is higher than the outside air pressure, and secondly when the chamber air pressure is lower than the outer air pressure. Thus, an improved cooling effect can be achieved for components provided on a substrate surface. Due to the bidirectional air flow the dust accumulation is lower than in high-volume unidirectional flow like fans. Finally, to provide the substrate with holes is a very easy and cheap way to provide nozzles.

Preferably, the pressure producing means comprise at least one membrane, which is adapted to be driven to suck in and expulse air in two movement phases, respectively wherein the two-movement phases are preferably cycled 5 to 500 times per second, more preferably 20 to 120 times per second. Such a membrane provides an easy and cheap engine, in order to produce the cyclic air pressure fluctuations. The driven at least one membrane can reach the high fluctuation frequencies (cycle times), which provide an efficient cooling effect, and prevent dust and dirt from entering the chamber.

Preferably, the at least one membrane is adapted to be magnetically driven. The driving is comparable to the driving of loudspeaker membranes.

Preferably, the pressure producing means comprises a pump, which contains a piezoelectric element. A piezoelectric element can operate at high frequency, driven by a low wattage AC driver.

Preferably, the cooling system further comprises a heat sink, which is connected to the substrate and/or at least one of the electronic components. The heat sink can provide an additional cooling effect, and is preferably made of a material with good heat conductivity, and comprises preferably a large surface.

Preferably, the cooling system is hermetically sealed to the outside, apart from the at least one hole. Thus it can be achieved that even small pressure fluctuations in the chamber produce air jets through the hole. Due to the constricted holes, turbulences are created, which efficiently cool the electronic components. The chamber is otherwise protected against contamination from the outside.

Preferably, the at least one hole is provided with restrictions to enhance the turbulence of the air jets. The more turbulent the air jets are, the more efficient the cooling effect on the surface of the electronic components is.

The present invention is further directed to an LED lamp, especially retrofit LED lamp, operating with electronic components, wherein the LED lamp has a cooling system for electronic components as described above. In retrofit LED lamps high intensity LEDs have to be used, and thus a very efficient cooling system, like presented above, is required. Due to the compactness of the cooling system, also the LED lamp can be designed smaller.

Preferably, the LED lamp comprises a bulb, which is provided on one of its ends with a socket, with at least one LED arranged inside the bulb, wherein the cooling system is arranged inside the bulb, such that the electronic components are positioned between the pressure producing means and the socket, wherein the electronic components operate the at least one LED.

The casing of the LED bulb is preferably not entirely sealed, but rather has openings like slots or holes etc., such that periodically air is pushed out from the inner volume of the bulb casing to the ambience, and is then sucked in again, when the cooling system drives through its cyclic movement phases.

Preferably, the LED lamp further comprises heat fins, wherein the heat fins are disposed such that the path of the cyclic air jets are directed along the heat fins towards the socket.

Thus, an even a better cooling effect can be provided, since on the one hand side the turbulent cyclic air jets directly affect and cool the surface of the electronic components, and on the other hand side the heat fins, which take away heat from the electronic components (LEDs), are cooled.

The present invention is further directed to a cooling method for electronic components comprising the steps of producing cyclic air pressure fluctuations by means, which are distanced from the electronic components, producing cyclic air jets by means in the vicinity of the electronic components, the means being affected by the cyclic air pressure fluctuations, wherein the cyclic air jets affect the surface of the electronic components.

Preferably, the cooling method comprises the steps of creating a cyclic chamber air pressure in a chamber, the air pressure being alternately higher and lower than the air pressure outside of the chamber, producing the cyclic air jets due to the cyclic chamber air pressure by at least one hole in a substrate, to which the electronic components are attached.

The cooling system and cooling method in the LED lamp, specifically the retrofit LED lamp, has the advantage that the air jets are not produced at locations remote to the heat producing electronic components, but are produced directly in the vicinity at the heat producing electronic components. This is due to the fact that the means, for example the holes in the substrate, are located very closely to the electronic components. Therefore, and due to the fact that the air jets are a turbulent air stream, a very efficient cooling of the electronic components can be achieved. Especially, electronic components, which dissipate different amounts of heat, can be individually and appropriately cooled by the means of the present invention. The electronic components do not necessarily have to be interfaced with heat sinks, and no air conducting paths are necessary, so that the cooling system, and accordingly the LED lamp with the cooling system, can be constructed very compact.

BRIEF DESCRIPTION OF THE DRAWINGS

The present invention is now explained in further detail with reference to the attached drawings.

FIGS. 2a and 2b show a cooling system according to the present invention.

FIGS. 3a and 3b show a cooling system according to the present invention.

FIGS. 4a and 4b show an LED lamp, especially a retrofit LED lamp according to the present invention.

DETAILED DESCRIPTION OF THE INVENTION

Figure 1B:
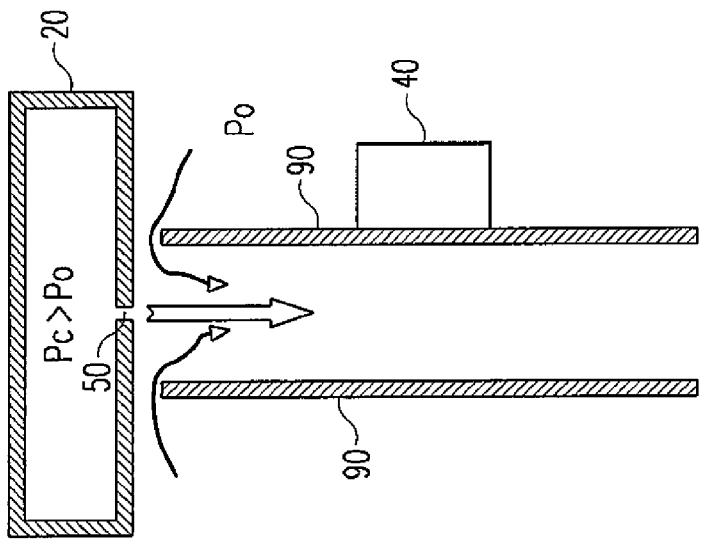
FIGS. 1a and 1b show a cooling system according to the state of the art.
Figure 1A:
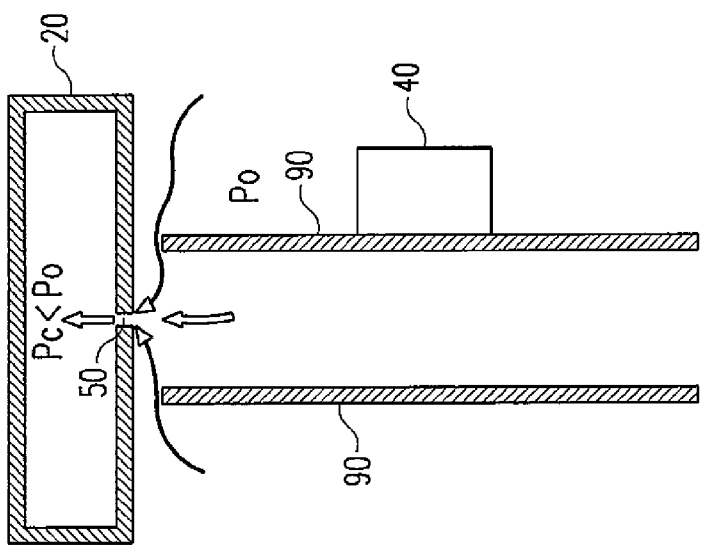

FIGS. 2a and 2b show a cooling system 1 according to the present invention. The cooling system 1 comprises means for producing cyclic air pressure fluctuations, wherein the electronic components 4 are distanced from the pressure producing means 7. The pressure producing means 7 operate in two phases. The first phase, "jet in", is shown in FIG. 2a. The second phase, "jet out", is shown in FIG. 2b. In the first phase the pressure producing means 7 produce a first air pressure, and in phase 2 the pressure producing means 7 produce a second air pressure, and by cyclically moving from phase 1 to phase 2 and back to phase 1, cyclically varying pressures can be created. A two-phase operation is the simplest operation mode. However, the pressure producing means could also operate in more than two phases. The cooling system 1 further comprises means 5, which produce cyclic air jets 6, when the means 5 are affected by the cyclic air pressure fluctuations produced by the pressure producing means 7. Due to the close position of the cyclic air jet 6 producing means 5, the surface of the electronic components 4 is very effectively cooled.

The pressure producing means 7 preferably is at least one membrane, which periodically sucks in and expulses air in the two movement phases, respectively, when driven. Membranes are understood to be very thin, preferably flexible sheets of material. Preferably the at least one membrane is driven magnetically like membranes of a loudspeaker. However, the pressure producing means can also be driven electrically or mechanically. The pressure producing means 7 are preferably provided inside a chamber 2, which is hermetically sealed off to the outside, except for at least one hole, slot or any another narrow restriction, through which air can flow to the outside. Generally a chamber 2 is understood to have an air volume enclosed by walls, which substantially isolate the enclosed air volume from the outside. In FIGS. 2a and 2b the air pressure in the chamber 2 is denominated with Pc, and the air pressure outside of the chamber 2 is denominated with Po. In FIGS. 2a and 2b a situation is shown, where the pressure producing means produce cyclic air pressure fluctuations. The chamber air pressure Pc is alternately higher and lower than the air pressure Po outside of the chamber 2.

In FIG. 2a, in the first phase, the chamber air pressure Pc is smaller than the outside air pressure Po, and consequently air is flowing from the outside to the inside of the chamber 2. Since the air can only flow through the at least one hole 5, which provides a narrow restriction, a turbulent air jet 6 is produced in the at least one hole 5. The at least one hole 5 in a wall of the chamber 2 is just one example for a restriction for the air flow, and other restrictions, having for example different shapes, are also conceivable. For example, small slots or channels can also translate the cyclic pressure differences in the chamber 2 into accelerated air jets, and produce turbulences. The at least one hole 5 should have an opening in a range of 100 μm to 8 mm. For example, openings of dimension 1*10 mm or 2*10 mm or 2*15 mm can provide an effective cooling, since turbulent air jets are efficiently produced. Preferably, the hole is located in a distance of 0 to 10 mm (so that the air jets are directed perpendicular to the facing direction of the component's cooled side) of the electronic components 4, so that the air jets 6 are directly produced in the area of the heat dissipating elements, and interact well with the surface of the electronic components 4 for a particular efficient cooling effect.

In FIG. 2b the air pressure Pc in the chamber 2 is higher than the air pressure Po outside of the chamber 2, and consequently the direction of the air flow is reversed from the inside of the chamber 2 to the outside. Again, turbulent air jets 6 are produced by the at least one hole 5, and the electronic components 4 are cooled. By driving through a cyclic transition from phase 1 and phase 2 and back, cyclic air jets 6 are produced by the at least one hole 5, which cool the electronic components 4 in both of the movement phases.

The sidewall of the chamber 2, onto which electronic components 4 are attached, is preferably a substrate 3 for the electronic components. The substrate can be a printed circuit board, PCB, or the like, and can be provided with metal lines for the power supply of electronic components, or to connect the electronic components 4 to each other, or to connect the electronic components 4 to light emitting diodes of a LED lamp. The substrate can also hold one or more control units and/or one or more sensors, which can automatically control the air pressure fluctuations inside the chamber 2. For example, the frequency of the fluctuations or the amount of fluctuations could be varied (i.e. the delta of the pressure fluctuations, or the delta of the air volume could be varied). By means of e.g. a temperature feedback from a temperature sensor, the best cooling setting could be automatically regulated.

The two phases of the pressure producing means should be driven with a frequency high enough to transport a volume of air that is sufficient for cooling, but low enough to minimize noise and flow losses. The air, which is periodically sucked in and ejected from the chamber 2, thereby produces the cyclic air jets 6, which cool the electronic components 4. Preferably 5 to 500 cycles, more preferably 20 to 120 cycles per second are driving the pressure producing means 7. Thus, the problem of accumulation of dust or other dirt inside of the chamber 2, which could hamper the cooling effect or the operation of the electronic components 4 as well as LEDs of a lamp, can be reduced. The at least one hole 5 can be provided with further restrictions, which can serve two purposes. The higher the turbulence of the air jets, the more effective the heat transport is. Further, the restrictions can help to avoid the accumulation of dust or other dirt inside the chamber 2. Since the chamber 2 is hermetically sealed to the outside, except for the at least one hole 5, which presents only a very small opening to the chamber 2, this problem is anyhow very well addressed in the present invention.

If more than one electronic component 4 is to be cooled simultaneously, also more holes 5 can be provided in the substrate 3. Also increasing the number of holes can increase cooling efficiency of one component. Especially, if components with different heat dissipation have to be cooled at the same time, strategically placing one or more holes 5 in close vicinity to each of the electronic components 4 can provide a very efficient cooling effect to the total system. The plurality of holes 5 can also vary in size and/or shape. Each electronic component 4 receives its individual air jets 6, which affect its surface for cooling. Electronic components 4 can be either attached to the inside surface of the substrate 3, which constitutes one wall of the chamber 2, or the outside surface. Thus, also several electronic components can be cooled with a single hole 5 or a single restriction, since the air jets 6 affect electronic components 4 on the outer surface and the inner surface of the substrate 3 likewise, due to the cyclic movement of the air jets 6.

The at least one membrane, which can compose the pressure producing means, is only an example and other pressure producing means, which are suited to provide a high enough pressure cycling frequency can be used. However, membranes provide a very easy way for high frequencies for producing cyclic pressure fluctuations. Moreover, the membrane can be magnetically driven, or can be driven by a pump containing a piezoelectric element, which is very easy to control with very low power consumption. A membrane also provides a way to implement pressure producing means without frictional parts, guaranteeing a long lifetime. A high frequency can also be achieved with a membrane. The frequency of the cyclic pressure fluctuations should be high enough, so that the isolated air volume in the chamber is simply agitated not exchanged, in order to keep the dust accumulation low. Preferred frequencies are in a range of 5 to 500, preferably 20 to 120 pressure fluctuations (cycles) per second. In the case of piezoelectric pump it can go up to 100 kHz.

FIGS. 3a and 3b are a further illustration of a cooling system 1 according to the present invention. Again, the first phase, wherein the pressure Pc inside the chamber 2 is lower than the outside pressure Po is shown in FIG. 3a, and the second phase, in which the pressure Pc in the chamber 2 is larger than the air pressure Po outside of the chamber 2 is shown in FIG. 3b. The cooling system 1 further comprises a heat sink 8, which is connected to the substrate 3, and the electronic components 4. However, such a heat sink 8 can also be connected only to the substrate 3, onto which the electronic components (or LEDs) 4 are mounted, or can be connected directly with only one or more of the electronic components 4. The heat sink further helps to remove heat from the surface of the electronic components. The heat sink is preferably made of a material with a high thermal conductivity, e.g. like copper or aluminum. The heat sink 8 is preferably connected to one or a plurality of heat fins 9. Alternatively, only heatsink fins 9 (without the heat sink 8) are provided, and are then connected either to the substrate 3 and/or at least one of the electronic components 4. Preferably, cyclic air jets 66 impinge on the heat fins 9, in order to provide an efficient heat transfer, so that the electronic components are cooled, additionally to the cooling of the air jets 6. The heatsink fins 9 are preferably elongate, and have a high surface, which interacts with air. The air jets 66 preferably are directed parallel to the elongate surface of the heatsink fins 9.

FIG. 3a shows a cooling system 1 with the chamber 2, which has the at least one hole 5 in the substrate 3, through which air jets 6 are produced to directly affect the surface of the electronic components 4 for cooling. Additionally, the chamber 2 comprises a hole or nozzle 55, which also produces air jets 66, which are directed along the longitudinal extension of the heat fins 9. Turbulences will be generated at the interface between the air jet 66 and the heat fins 9 on the path of the air jet 66. The created turbulences at the heat fins 9 serve to cool the heat fins 9, and consequently also transfer heat away from the electronic components 4, which are in direct or indirect thermal contact with the heatsink fins 9. Additionally, secondary air will be sucked in and flow together with the air jet 66, and secondary air will also be moved together with an expulsed air jet 66. This creates additional air volume around the surface of the one or more heat fins 9, so that the cooling effect is enhanced. As shown in FIG. 3a, multiple heat fins 9 can be provided in parallel to increase the surface, which can be cooled by the air jet 6a. The multiple heat fins 9 do not necessarily have to be oriented parallel to each other, but can also be oriented oblique to each other. Again, the at least one nozzle or hole 55 can be provided with restrictions, like grit, pores or a net, in order to prevent dust and dirt to enter the chamber 2, when the pressure is fluctuated and the air cyclically sucked in and expulsed.

FIGS. 4a and 4b show an LED lamp 100, preferably a retrofit LED lamp, according to the present invention. The LED lamp has a bulb (preferably a dome-shaped cover or a lens), which is preferably made of glass or plastic, and is transparent to visible light. The envelope 13 has a socket 11 on one of its ends, which is preferably made to fit standard connectors for electric power supply of the lamp 100 such as E27, E14, GU10 etc. Inside of the lamp 100 at least one or more LEDs 12 produce visible light. The bulb 10 can be provided with phosphor and/or scattering material(s), which converts and/or scatter the light emitted from the one or more LEDs 12, or adds one or more further spectral bands to the emitted light, by stimulated emission. For example, the LEDs 12 inside the bulb 10 can be designed to emit blue light, and a phosphor material inside the bulb 10 or provided as a layer on the outer or inner surface of the bulb 10, emits another wavelength when excited by the blue light.

Color-converting phosphor materials could be applied at the LEDs directly e.g. in globe-tops or prefabricated sheets. LEDs emitting monochromatic light could be applied. The globe-tops and the prefabricated color conversion sheets could comprise scattering materials such as $TiO_2$, $SiO_2$, $Al_2O_3$, $BaTiO_3$; $ZrO_2$ as well. The light emitted by the LED lamp 100 will appear white. Another way to produce white light inside the LED lamp 100 is to provide multiple, different color range emitting LEDs 12, which in combination appear white to an outside viewer.

Inside the envelope 13 also the cooling system 1 as described above is arranged, and is preferably positioned such that the electronic components 4 are positioned between the pressure producing means 7 and the socket 11. The electronic components 4, which are cooled by the cooling system 1 are operating the at least one LED 12. Since the cooling system 1 according to the present invention can be designed to be very compact, it fits well into even small casing/housing of retrofit LED lamps 100. The electronic components 4 are cooled inside of the envelope 13. The casing of the bulb 13 is preferably not entirely sealed, but might have openings, like slots, holes or the like preferably at the socket 11, so that periodically air is pushed out from the inner volume of the envelope 13, and then is sucked in again, when the second phase of the cooling system 1 is in effect.

The cooling system 1 inside of the envelope 13 further can comprise heat fins 9. The heat fins 9 should be positioned in an arrangement that the path of the cyclic air jets 6, 66 is directed along the heat fins 9 towards the socket 11. Thus, the heat is very efficiently transferred away from the LEDs 12/LED-Module 14/bulb 10/envelope 13, and is preferably transferred to the location of the above described openings 16 preferably at the socket, providing a strongly improved and efficient cooling of the LED lamp 100.

The at least one LED 12 is preferably situated on a support 15 above the chamber 2, and is connected to the electronic components 4 by means of electrical wiring inside the envelope 13. Electrical wiring can preferably run along the chamber 2, either on an outside or inside wall thereof. The at least one LED 12 is positioned so that its emitted light is not blocked by the cooling system 1 of the present invention. The emitted light leaving though the bulb 10 has a preferably semi-spherical emission pattern. The emission pattern could be different in case of the application of a lens at a spot/downlight retrofit LED lamp. Preferably, the electronic components 4 are situated distanced from the LED 12, so that heat produced by the electronic components 4 does not influence the operation, lifetime or emission spectrum of the at least one LED 12.

The present invention further discloses a method, which can be used to cool electronic components 4, for example electronic components 4 operating an LED lamp 100, in particular a retrofit LED lamp. The method comprises the steps of producing cyclic air pressure fluctuations, by the pressure producing means 7 as explained above, wherein the pressure producing means 7 should be distanced from the electronic components 4. The method further comprises the production of cyclic air jets 6 by means, e.g. holes 5 in a substrate 3, wherein the means 5 are affected by the cyclic air pressure fluctuations produced by the pressure producing means 7. These cyclic air jets 6 affect the surfaces of the electronic components 4, in order to sink heat from these surfaces by increasing heat transfer to provide an efficient cooling effect. Particularly, the method comprises to create a cyclic chamber air pressure in a chamber 2, wherein the air pressure is alternately higher and lower than the air pressure outside of the chamber 2. Such a cyclically alternating air pressure can also be produced inside of a LED lamp 100.

In summary, since the air jets 6 produced by the present invention, originating directly from the vicinity of the heat dissipating elements, i.e. the electronic components 4, the heat transfer causing the cooling effect is improved. The pressure producing means 7 only actuate the pressure Pc inside a chamber 2, but do not directly produce the air jets 6. The air jets 6 are produced through restrictions, preferably holes 5 of a substrate 3, which is PCB, onto which electronic components 4 are mounted. Thus, the air jets 6 directly influence the surfaces of the electronic components 4, and since the air jets 6 are turbulent, a very efficient cooling effect is achieved.

The invention claimed is:

1. A cooling system (1) for electronic components (4) comprising
    means (7) for producing cyclic air pressure fluctuations, wherein the electronic components (4) are distanced from the pressure producing means (7);
    converting means (5) for converting the cyclic air pressure fluctuations into cyclic air jets (6), wherein the converting means (5) are arranged in the vicinity of the electronic components (4), so that the cyclic air jets (6) are turbulent air streams and produced directly at the location of the electronic components (4) in order to increase the heat transfer at the surface of the electronic components (4), and
    wherein the converting means (5) comprises at least one opening in a range of 100 µm to 8 mm and wherein a distance between the electronic components (4) and the converting means (5) is less than 10 mm
    wherein the cooling system (1) further comprises
    a chamber (2), wherein the pressure producing means (7) are provided and produce a cyclic chamber air pressure (Pc), which is alternately higher and lower than the air pressure (Po) outside of the chamber (2);
    a substrate (3) constituting one side wall of the chamber (2), the electronic components (4) being attached to a surface of the substrate (3);
    wherein the substrate (3) is provided with at least one hole (5), which produces the cyclic air jets (6) due to the cyclic chamber air pressure (Pc).

2. The cooling system (1) according to claim 1, wherein the pressure producing means (7) comprise at least one membrane, which is adapted to be driven to suck in and expulse air in two movement phases, respectively, wherein the two-movement phases are cycled 5 to 500 times per second.

3. The cooling system (1) according to claim 2, wherein the at least one membrane is adapted to be magnetically driven.

4. The cooling system (1) according to claim 1, wherein the pressure producing means (7) comprise a pump, which contains a piezoelectric element.

5. The cooling system (1) according to claim 1, further comprising a heat sink (8), which is connected to the substrate (3) and/or at least one of the electronic components (4).

6. The cooling system (1) according to claim 5, further comprising a plurality of heatsink fins (9), which are connected to the substrate (3) and/or at least one of the electronic components (4) and/or the heat sink (8), wherein the cyclic air jets (6) impinge on the heatsink fins (9).

7. The cooling system (1) according to claim 1, wherein apart from the at least one hole (5) the chamber (2) is hermetically sealed to the outside.

8. The cooling system (1) according to claim 1, wherein the at least one hole (5) is provided with restrictions (5*a*) to enhance the turbulence of the air jets (6).

9. A LED lamp (100), especially retrofit LED lamp, operating with electronic components (4), wherein the LED lamp (100) has a cooling system (1) according to claim 1 for the electronic components (4).

10. The LED lamp (100) according to claim 9, comprising
    a bulb (10), which is provided on one of its ends with a socket (11);
    at least one LED (12) arranged inside the envelope (13);
    wherein the cooling system (1) is arranged inside envelope (13), such that the electronic components (4) are positioned between the pressure producing means (7) and the socket (11), wherein the electronic components (4) drive the at least one LED (12).

11. The LED lamp (100) according to claim 10, further comprising heatsink fins (9), wherein the heatsink fins (9) are arranged on such a way that the path of the cyclic air jets (6) are directed along the heat fins (9) towards the socket (11).

12. The cooling system (1) according to claim 2, wherein the two-movement phases are cycled 20 to 120 times per second.

13. A cooling method for electronic components (4) comprising the steps of
    producing cyclic air pressure fluctuations by means (7), which are distanced from the electronic components (4);
    producing cyclic air jets (6) by converting means (5) arranged in the vicinity of the electronic components (4), so that the cyclic air jets (6) are turbulent air streams and produced directly at the location of the electronic components (4), wherein the converting means (5) being affected by the cyclic air pressure fluctuations, and wherein the cyclic air jets (6) affect the surface of the electronic components (4),
    wherein the converting means (5) comprises at least one opening in a range of 100 µm to 8 mm and wherein a distance between the electronic components (4) and the converting means (5) is less than 10 mm creating a cyclic chamber air pressure (Pc) in a chamber (2), the air pressure (Pc) being alternately higher and lower than the air pressure (Po) outside of the chamber (2); and producing the cyclic air jets (6) due to the cyclic chamber air pressure (Pc) by at least one hole (5) in a substrate (3), to which the electronic components (4) are attached.

\* \* \* \* \*